United States Patent
Kaimoto et al.

[11] Patent Number: 6,120,977
[45] Date of Patent: *Sep. 19, 2000

[54] PHOTORESIST WITH BLEACHING EFFECT

[75] Inventors: Yuko Kaimoto; Satoshi Takechi; Akira Oikawa, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/627,251

[22] Filed: Apr. 3, 1996

Related U.S. Application Data

[63] Continuation of application No. 08/284,245, Aug. 2, 1994, abandoned.

[30] Foreign Application Priority Data

Oct. 26, 1993 [JP] Japan .................. 5-267628

[51] Int. Cl.$^7$ .................. G03C 5/16; G03C 1/73
[52] U.S. Cl. .................. 430/330; 430/326; 430/270.1; 430/910; 430/919; 430/921; 522/8; 522/27; 522/28
[58] Field of Search .................. 430/270.1, 326, 430/330, 910, 919, 921; 522/8, 27, 28

[56] References Cited

U.S. PATENT DOCUMENTS

| | | | |
|---|---|---|---|
| 4,491,628 | 1/1985 | Ito et al. | 430/326 X |
| 4,904,563 | 2/1990 | Aoai et al. | 430/138 |
| 5,227,276 | 7/1993 | Roeschert et al. | 430/270 X |
| 5,314,786 | 5/1994 | Roeschert et al. | 430/270 |
| 5,338,641 | 8/1994 | Rawlowski et al. | 430/270 X |
| 5,340,682 | 8/1994 | Pawlowski et al. | 430/270 X |
| 5,399,647 | 3/1995 | Nozaki | 430/270.1 |
| 5,443,690 | 8/1995 | Takechi et al. | 430/286 |

FOREIGN PATENT DOCUMENTS

| | | | |
|---|---|---|---|
| 4-39665 | 2/1992 | Japan | G03F 7/038 |
| 5-265212 | 10/1993 | Japan | G03F 7/039 |
| 53-46668 | 12/1993 | Japan | 430/270 |

OTHER PUBLICATIONS

English Translation of JP–4–39665 Takechi Feb. 10, 1992.
English Translation of JP–5–265212 Kaigen et al, Oct. 15, 1993.
Kaimoto et al. "Alicyclic Polymer for ArF and KrF Excimer Resist Based on Chemical Amplification," SPIE vol. 1672, Advances in Resist Technology and Processing IX Mar. 1992, pp. 66–73.
"Application of Silylether and Silylester Polymer for Chemical Amplification System", AOAI et al, Journal of Photopolymer Science and Technology, vol. 3, No. 3, 1990, pp. 389–400.
"Chemically Amplified DUV Photoresist Using a New Class of Phoptocaid Generating Compounds", Pawlowski et al, SPIE vol. 1262 Advances in Resist Tehnology and Processing VII, 1990, pp. 16–25.

*Primary Examiner*—Bernard Codd
*Attorney, Agent, or Firm*—Arent Fox Kintner Plotkin & Kahn PLLC

[57] ABSTRACT

An exposure technique which accomplishes high transparency and the prevention of influence of reflected light in the ultraviolet region of KrF excimer laser light, the technique being capable of decreasing reflected light by employing a base polymer having high transparency in the ultraviolet region and by employing a bleaching agent in combination with a photo acid generator, the bleaching agent being capable of preventing the formation of eaves in an upper portion of a resist pattern.

12 Claims, 7 Drawing Sheets

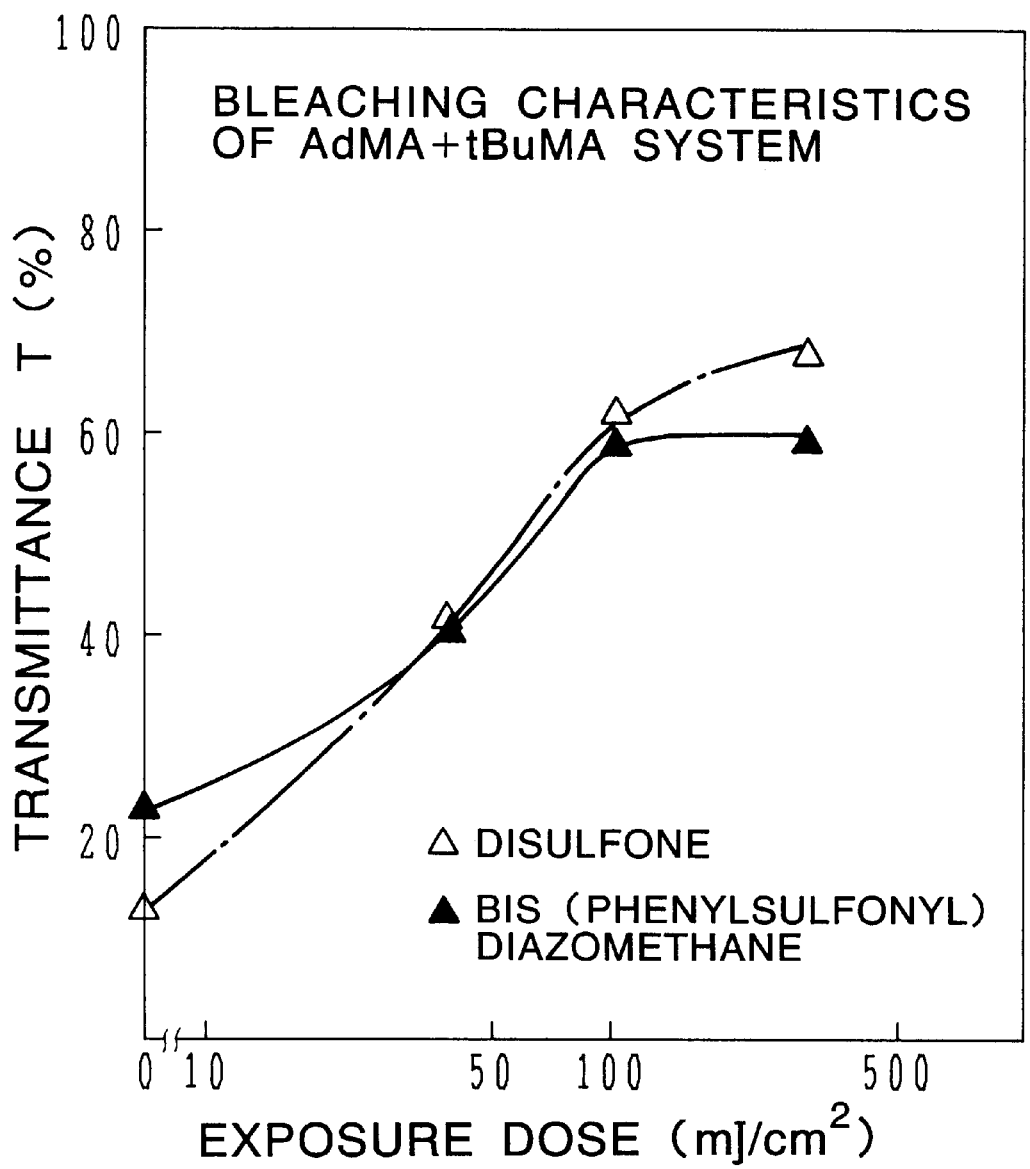

PHOTORESIST WITH BLEACHING EFFECT

This application is a continuation of application Ser. No. 08/284,245 filed Aug. 2, 1994 now abandoned.

BACKGROUND OF THE INVENTION

1. Field of the Invention

The present invention relates to a technique of optical exposure, particularly to a technique of optical exposure using ultraviolet light for forming a fine pattern.

2. Description of the Related Art

In semiconductor integrated circuit devices, the enhancement of integration and fine processing of the devices is under way. The processable line width is decreasing from submicron order to half micron order at present, and it is therefore desired to develop a technique of fine processing in half micron or smaller order.

For coping with the above requirement, the light source for photolithography is being shifted from a mercury lamp, g-line (436 nm) and i-line (365 nm), to KrF (248 nm) of an excimer laser and further to ArF (193 nm) thereof.

In the photolithography using g-line and i-line from a mercury lamp, it is general. practice to use a novolak resin material for a photoresist. Since, however, a novolak resin shows high absorption in a deep ultraviolet region, e.g., at 248 nm of KrF, it is no longer suitable for use as a resist material.

FIGS. 2A and 2B schematically show states in which a positive resist of a novolak resin is exposed to light from a KrF excimer laser.

In FIG. 2A, an etchable wiring layer 52 is formed on a semiconductor substrate 51, and a resist layer 53 of a novolak resin is formed on the wiring layer 52. A light-shielding mask 54 is placed above the resist layer 53, and the resist layer is exposed to deep ultraviolet light 55 at 248 rin from a KrF excimer laser. The deep ultraviolet light 55 comes into the resist layer 53 through an opening of the light-shielding mask 54.

Meanwhile, the resist layer 53 shows strong absorption to deep ultraviolet light at 248 nm. As deep ultraviolet light moves within the resist layer 53, its light amount greatly decreases as shown on the right in FIG. 2A. It is therefore difficult to expose the resist layer 53 to sufficient light all through the depth thereof.

When the resist layer 53 is developed after the above exposure, a resist pattern as shown in FIG. 2B is liable to be formed. That is, an opening 56a having intended dimensions is formed, while the opening becomes narrower in a tapered shape toward the interior of the resist layer, and no "through" pattern is formed, or an opening 56b in the bottom portion has only smaller dimensions than the opening 56a in the upper portion. When the so-formed resist pattern is used, no intended pattern is obtained, or the pattern accuracy greatly decreases.

As a substitute for the novolak resist, therefore, the development of a chemically amplifiable resist containing a base polymer having high transparency in a deep ultraviolet light region has been under way. The chemically amplifiable resist refers to a resist containing a base polymer and a photo acid generator. When the resist is exposed to ultraviolet light, the photo acid generator in the resist generates acid. When the resist is baked after the exposure, the generated acid works as a catalyst to deblock of polymer pendant groups, and the like.

The chemically amplifiable resist can contain a base polymer having sufficiently high transparency at the KrF wavelength, and can overcome the problem caused by extremely high optical absorption of a resist as shown in FIG. 2.

When, however, the resist has too high transparency, there is another problem caused by reflection from an underlayer. For example, when a processable layer having a high reflectance such as a layer of aluminum (Al) or tungsten suicide formed on an uneven surface is subjected to patterning, the reflection on the processable layer surface decreases the pattern accuracy.

FIGS. 3A and 3B show schematically show a problem caused by optical reflection on the processable layer surface. In FIG. 3A, a structure of an oxide layer 58 is selectively formed on the surface of a semiconductor substrate 57, and an uneven surface is formed thereon. A wiring layer 52 having a high reflectance is formed on the uneven surface, and a resist layer 59 is formed for patterning the above wiring layer 52.

A light-shielding mask 54 is placed above the resist layer 59, and deep ultraviolet light 55 is directed from above the light-shielding mask 54. The deep ultraviolet light 5 comes into the resist layer 59 through an opening of the light-shielding mask 54.

The resist layer 59 shows low optical absorption to the incoming ultraviolet light, and the deep ultraviolet light 55 comes through the resist layer 59 and arrives at the under-surface of the resist layer 59. The processable layer 52 having a high optical reflectance is disposed on the under-surface of the resist Layer 59. As a result, the deep ultraviolet light 55 is reflected on the processable layer 52 surface. When the substrate has an uneven surface, reflected light does not return through an optical path of incoming light, but light is scattered (reflected) out of the optical. path.

When convex portions are present on two sides as shown in FIG. 3A, deep ultraviolet Light incident on a slope is scattered toward a central portion which is to be shielded against light. As a result, the resist region which should be shielded against light is exposed to the light to decrease the pattern accuracy. A like phenomenon also takes place when the processable layer has an irregular reflection surface.

FIG. 3B shows the form of a resist pattern formed on an uneven surface as shown in FIG. 3A after development when a positive resist layer has too high transparency.

In that region of the resist layer 59 which is between the convex portions of the oxide layer 58 on the substrate 57 surface, the width of the resist pattern 59a is decreased in the above region slnce the above region is exposed to tight reflected from the slopes.

When the above-obtained resist pattern 59a is used for patterning a wiring layer (processable layer) 52 located on the undersurface of the resist pattern 59a, the width of the patterned wiring layer is so decreased in the region located between the convex portions of the oxide layer 58 as the width of the resist pattern 59a has been decreased in the corresponding region. When the reflection is intense as described above, no intended pattern is obtained.

The optical transparency of the chemically ampilfiable resist to light can be controlled by adjusting the amount of the photo acid generator. However, general photo acid generator show nearly constant absorption coefficients. When the amount of the photo acid generator is small, the effect of decreasing the reflection is insufficient. When the amount of the photo acid generator is too large, the resist shows too intense absorption, and the pattern profile is formed in a tapered pattern.

Further, the acid generated by the photo acid generator works as a catalyst in the deblocking of protective groups in the base polymer of the resist, while the resist shows low sensitivity when the amount of the acid is insufficient.

Further, there is known a phenomenon in which the upper portion of a resist pattern forms eaves when the chemically amplifiable resist, a positive type in particular, is used. FIGS. 4A and 4B show the phenomenon in which the upper portion of a resist pattern forms eaves.

As shown in FIG. 4A, a chemically amplifiable resist 62 is applied onto a processable layer 61, and the resist is exposed, for example, in a stripe (line and space) pattern.

When the chemically amplifiable resist layer 62 is developed after the exposure, the upper portion of a developed resist pattern 62a has eaves 63 having a form extending from the resist pattern as shown in FIG. 4B.

The above phenomenon is considered to take place for the following reason. When the chemically amplifiable resist layer 62 is exposed to deep ultraviolet light, the photo acid generator in the chemically amplifiable resist layer 62 generates an acid, and on the resist layer surface, contaminations such as an amine from air react with H+ generated from the photo acid generator and deactivate (neutralize) the acid to cause an insolubilization reaction. Or, the acid generated when the exposed resist is baked volatilizes so that the acid concentration in the vicinity of the resist surface decreases. When the amount of the photo acid generator is increased for preventing the formation of the eaves, the optical absorption is intensified to increase the tendeticy to form a tapered pattern.

As explained above, the transparency of the chemically amplifiable resist to incident deep ultraviolet light could be controlled by adjusting the amount of the photo acid generator. However, it is difficult to optimize the transparency of the chemically amplifiable resist on the basis of the chemically amplifiable resist amount alone.

SUMMARY OF THE INVENTION

It is an object of the present invention to provide a technique of exposure which accomplishes high transparency and the prevention of influence of reflected light in the deep ultraviolet region of KrF excimer laser light.

According to the first aspect of the present invention, there is provided a resist for use with deep ultraviolet light, which comprises a chemically amplifiable resist consisting essentially of a base polymer and an photo acid generator, and a bleaching agent added to the chemically amplifiable resist.

There is provided a technique in which a resist layer has high transparency in deep ultraviolet tight wavelength such as KrF excimer laser wavelength and the influence of reflected light is prevented, by incorporating a bleaching agent in combination with an photo acid generator. The bleaching agents decompose quickly upon deep UV (ultraviolet) irradiation and lose efficiently their absorption in some exposure wavelength region. The bleaching efficiencies thus tend to be saturated.

Further, the problem of eaves in the opening surface portion in a chemically amplifiable resist can be decreased. It is considered that this effect takes place since the bleaching agent is optically decomposed by its optical exposure to form an acid. The bleaching agent therefore may be used as a photo acid generator.

As described above, there is provided a technique of exposure which shows excellent performance in the deep ultraviolet region such as KrF excimer laser light.

Reflected light can be decreased even on a material having a high reflectance such as WSi, and an excellent pattern form can be provided even on an uneven surface.

Further, the formation of eaves in the upper portion of a pattern can be prevented.

BRIEF DESCRIPTION OF THE DRAWINGS

FIG. 7 is a graph showing the bleaching properties of an adMA. tBuMa system.

DESCRIPTION OF THE PREFERRED EMBODIMENTS

EXAMPLES

As a typical base polymer for a chemically amplifiable resist, there are known a polymer containing adamarntyl methacrylate and a polymer containing vinylphenol. It is also known that these base polymers have high transparency and high dry-etching resistance.

Figure 5:
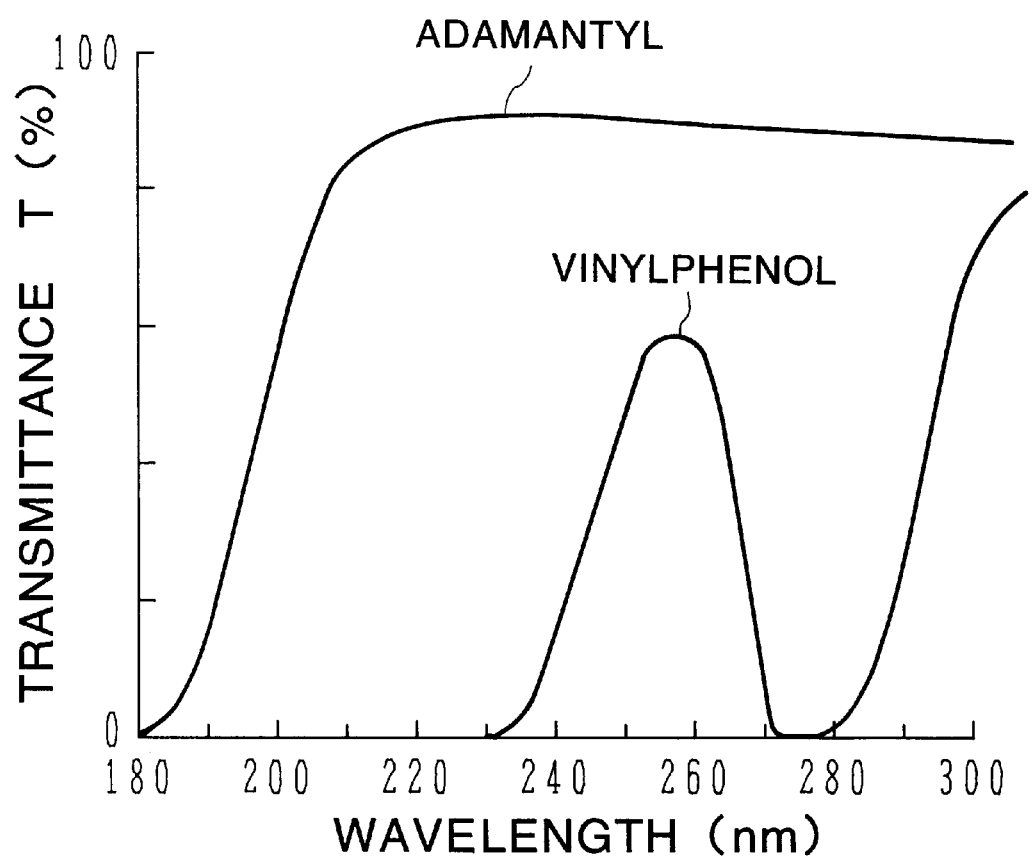
FIG. 5 is a graph showing the transmittance characteristics of an adamantyl methacrylate-based base polymer and a vinylphenol-based base polymer.

FIG. 5 shows the transmittance characteristics of a base polymer having an adamantyl methacrylate or a base polymer having a vinylphenol. Both these base polymers have high transparency at the wavelength (248 nm) of a KrF excimer laser. The adamantyl methacrylate-based base polymer retains transparency at the wavelength (193 nm) of an ArF excimer laser. In the present specification, the "deep ultraviolet light" refers to light having a wavelength of 300 nm or shorter, particularly light having a wavelength of 240 to 270 nm.

A base polymer having a vinylphenol(skeleton) is commercially available as a product supplied by Maruzen Petrochemical Co., Ltd. (Japan), while a base polymer having an adamantyl methacrylate is hardly commercially available. Synthesis Examples for a base polymer having at an adamantyl methacrylate are therefore described below.

SYNTHESIS EXAMPLE 1 (Synthesis of adamantyl methacrylate. tert-butyl methacrylate copolymer)

A reactor is is charged with 8.33 g (0.04 mol) of adamantyl methacrylate of the formula (1),

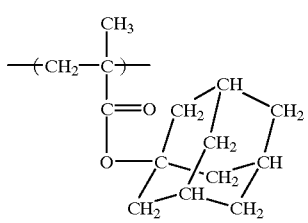

(1)

5.68 g (0.04 mol) of tert-butyl methacrylate of the formula (2).

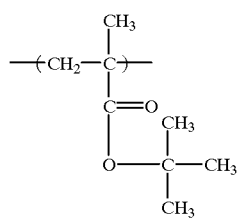

(2)

and 160 ml of toluene (0.5 M), and 1.9704 g (15 mol %) of azobisisobutyronitrile, $(CH_3)_2C(CN)N=NC(CH_3)_2CN$, is added. The mixture is stirred in nitrogen atmosphere at 80° C. about 7 hours.

A small amount of hydroquinone is added to the above-obtained reaction mixture and the reaction stops. Next, 2.5 liters of hexane containing 25 ml of ethanol are added to the above-obtained reaction mixture to form a precipitate. The resultant white precipitate is recovered by suction-filtration with a glass filter, and dried at 40° C. a reduced pressure of 0.1 mmHg in a vacuum desiccator for 6 hours.

The resultant white powder is again dissolved in tetrahydrofuran to prepare a 30 ml solution, and 2.5 liters of hexane containing 25 ml of ethanol is added to the solution to re-form a precipitate. The so-obtained white precipitate is recovered by suction filtration, and dried at 40° C. at a reduced pressure of 0.1 mmHg in a vacuum desiccator for about 16 hours. In this manner, there was obtained a polymer having Molecular weight of 8,600, degree of dispersion of 1.78 and an adamantyl:tert-butyl copolymerization ratio of 56:44.

SYNTHESIS EXAMPLE 2 (Synthesis of adamantyl methacrylate. tert-butyl methacrylate copolymer)

A copolymer was obtained in the same manner as in Synthesis Example 1 except that the amount of adamantyl methacrylate was changed to 5.00 g (0.024 mol) and that the amount of tert-butyl methacrylate was changed to 9.76 g (0.024 mol).

The mixing ratio of adamantyl methacrylate and tert-butyl methacrylate was changed as above, whereby the above-obtained copolymer had Molecular weight of 8,600, degree of dispersion of 1.78 and an adamantyl:tert-butyl copolymerization ratio of 30:70.

A base polymer which is a copolymer from vinylphenol and tert-butyl methacrylate may be supplied by Maruzen Petrochemical Co., Ltd., Japan while it may be synthesized. In these base polymers, the functional group is from tert-butyl methacrylate, and the adamantyl skeleton and the vinylphenol skeleton improve dry-etching resistance and transparency.

EXAMPLE 1

A resist was prepared as follows. Added to the adamantyl methacrylate. tert-butyl methacrylate copolymer (56:44) synthesized in Synthesis Example 1 were 15% by weight, based on the copolymer, of triphenylsulforiuml hexafluoro-antimornate of the formula (3),

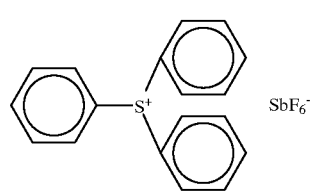

(3)

as a photo acid generator and 5% by weight, based on the copolymer, of a commercially available diphienylsulfone of the formula (4),

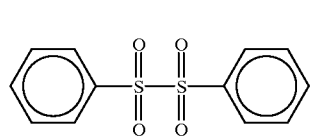

(4)

as a bleaching agent, and the mixture was dissolved in cyclohexanone to prepare a solution thereof (14%) in cyclohexanone. The so-obtained resist had an initial deep ultra-violet light transmittance (248 nm) of about 15%/$\mu$m. The above resist was applied onto a silicon wafer and baked at about 65° C. for 20 minutes to form a resist film having a thickness of 0.7 $\mu$m.

The silicon wafer having the so-baked resist film was exposed using KrF excimer laser stepper and baked at about 100° C. for 60 seconds. Then, the resist film was developed with a solution of a 2.38 wt % tetramethylammonium hydroxide solution for 1 minute.

Figure 1A:
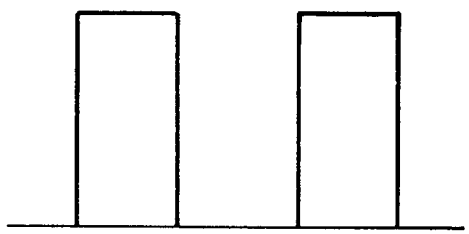
FIGS. 1A to 1E show schematic cross-sectional views of chemically amplifiable resist patterns of Examples of the present invention and resist patterns of Comparative Examples.

A 0.35$\mu$ stripe (line and space) pattern was formed by the exposure at 180 mJ/cm$^2$ to resolve a perpendicular pattern as shown in FIG. 1A. The formation of eaves was not found. For comparison, Comparative Example using no bleaching agent is described below.

COMPARATIVE EXAMPLE 1

Added to the same adamantyl methacrylate. tert-butylmethacrylate copolymer (56:44) as that synthesized in Synthesis Example 1 was 20% by weight, based on the copolymer, of triphenylsulfonium hexafluoroantimonate as a photo acid generator, and the mixture was dissolved in cyclohexanone to prepare a solution thereof (15 wt %) in cyclohiexanone. This resist had a transmittance, at 248 nm, of about 30%/$\mu$m.

The above-obtained resist solution was applied onto a silicon wafer and baked at about 60° C. for 100 seconds to form a resist film having a thickness of 0.7 $\mu$m. The silicon wafer having the resist film formed thereon was exposed using a KrF excimer laser stepper, then baked at about 100° C. for 60 seconds and developed with a 2.38 wt % tetramethylammonium hydroxide solution for 1 minute.

A 0.4 $\mu$m line and space pattern was formed by the exposure at 190 mJ/cm$^2$ and development. As a result, the line and space pattern was resolved, while the top profile in the resist film formed eaves as shown in FIG. 1B and the pattern was cross-sectionally tapered having gradually enlarged dimensions toward the bottom.

The pattern obtained in Example 1 was cross-sectionally perpendicular and excellent as compared with the pattern obtained in Comparative Example 1, although the pattern obtained in Example 1 had a smaller pattern width than the counterpart in Comparative Example 1.

EXAMPLE 2

Added to the adamantyl methacrylate. tert-butyl methacrylate copolymer (30:70) synthesized in Synthesis Example 2 were 15% by weight, based on the copolymer, of triphenylsulfonium hexafluoroantimonate as a photo acid generator and 5% by weight, based on the copolymer, of diphenyl sulfone as a bleaching agent, and the mixture was dissolved in cyclohexanone to prepare a solution thereof (14 wt %) in cyclohexarione. The so-obtained resist had an initial transmittance, at 248 nm, of about 10%/μm. The above resist was applied onto a silicon wafer and baked at about 65° C. for 20 minutes to form a resist film having a thickness of 0.7 μm.

The silicon wafer having the resist film formed thereon was exposed using KrF excimer laser stepper and baked at about 100° C. for 60 seconds. Then, the resist film was developed with a solution of a 2.38 wt % tetramethylammonium hydroxide solution for 1 minute.

A 0.35μ line and space pattern was formed by the exposure at 40 mJ/cm² to resolve a cross-sectionally perpendicular pattern as shown in FIG. 1A. The formation of eaves was not found. The following Comparative Example 2 was carried for comparing its results with the results of Example 2.

COMPARATIVE EXAMPLE 2

Added to the same adamantyl methacryiate. tert-butytmethacrylate copolymer (30:70) as that synthesized in Synthesis Example 2 was 20% by weight, based on the copolymer, of triphenylsulfonium hexafluoroantimonate as a photo acid generator, and the mixture was dissolved in cyclohexanone to prepare a solution thereof (15 wt %) in cyclohexanone. This resist solution had a transmittance, at 248 nm, of about 30%/μm.

The above-obtained resist solution was applied onto a silicon wafer and baked at about 60° C. for 100 seconds to form a resist film having a thickness of 0.7 μm. The silicon wafer having the resist film formed thereon was exposed using KrF excimer laser stepper, and then baked at about 100° C. for 60 seconds. The exposed resist film was developed with a 2.38 wt % tetramethylammonium hydroxide solution for 1 minute.

A 0.4 μm line and space pattern was formed by the exposure at 48 mJ/cm² and development. As a result, the line and space pattern was resolved, while the top profile of the resolved pattern formed eaves as shown in FIG. 1C, and the pattern was cross-sectionally tapered having trapezoidally formed sides.

In Example 2, the bleaching agent was also added similarly to Example 1. Therefore, the line and space pattern having a smaller width than that in Comparative Example could be resolved in a pattern form excellent over that in Comparative Example.

The chemically amplifiable resist containing a base polymer having an adamantyl skeleton has been explained above, and the chemically amplifiable resist containing a base polymer having a vinylphenyl skeleton of the formula,

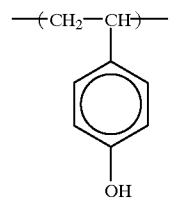

will be explained hereinafter.

EXAMPLE 3

Added to a vinylphenol. tert-butyl methacry-late copolymer (61:39) supplied by Maruzen Petrochemical Co., Ltd. (Japan) were 3% by weight, based on the copolymer, of triphenylsulfornium triflate of the formula,

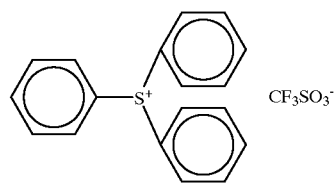

as a photo acid generator and 15% by weight, based on the copolymer, of diphenyl sulfone as a bleaching agent, and the mixture was dissolved in ethyl lactate to prepare a solution thereof (18 wt %) in ethyl lactate. This resist solution had an initial transmittance, at 248 nm, of about 12%/μm.

Figure 6:
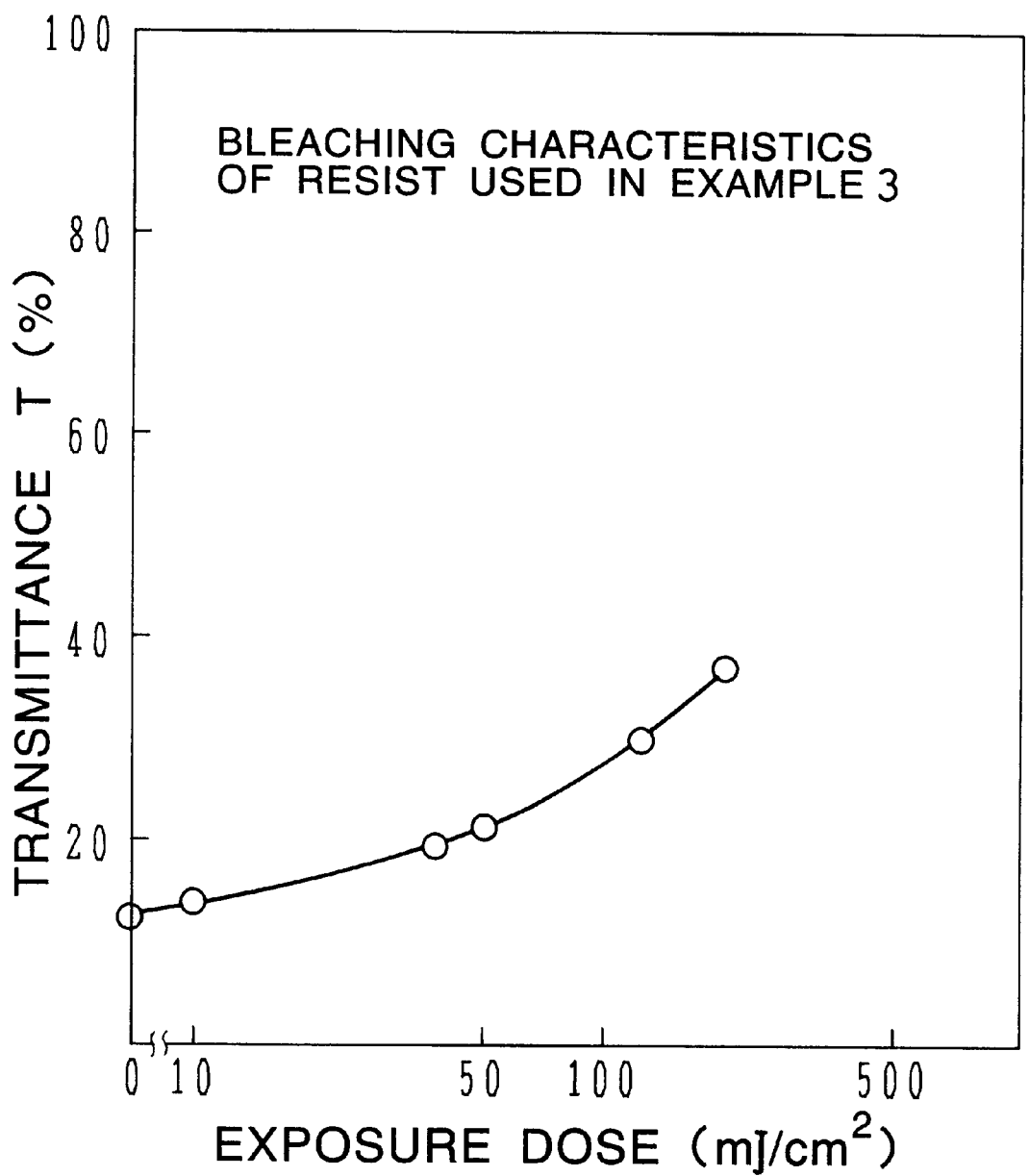
FIG. 6 is a graph showing the bleaching properties of a resist used in Example 3.

FIG. 6 shows the change OF transmittance of the above resist relative to an exposure dose. tn FIG. 6, the initial transmittance is about 12%, while, with an increase in an exposure dose, the transmittance increases (the resist becomes transparent), and when the exposure dose is about 200 mJ/cm², the transmittance is about 40%.

The above resist solution was applied onto a silicon wafer and baked at about 110° C. for 90 seconds to form a resist film having a thickness of 0.7 μm. The silicon wafer having the resist film formed thereon was set at a KrF excimer laser stepper, exposed to KrF excimer laser light and baked at about 90° C. for 60 seconds. Then, the resist film was developed with a solution of a 2.38 wt % tetramethylammonium hydroxide solution for 1 minute.

Figure 1D:
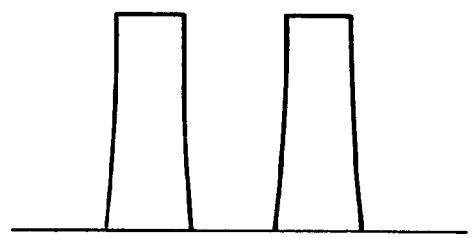
Figure 1B:
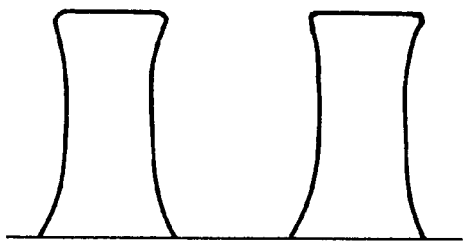
Figure 1E:
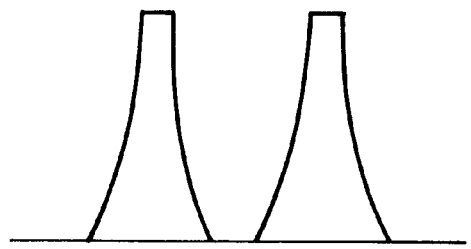
Figure 1C:
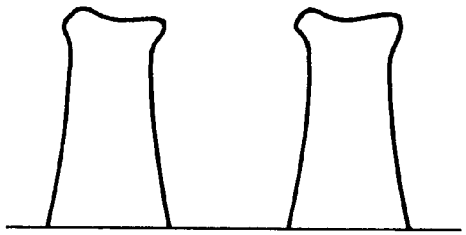
Figure 2A:
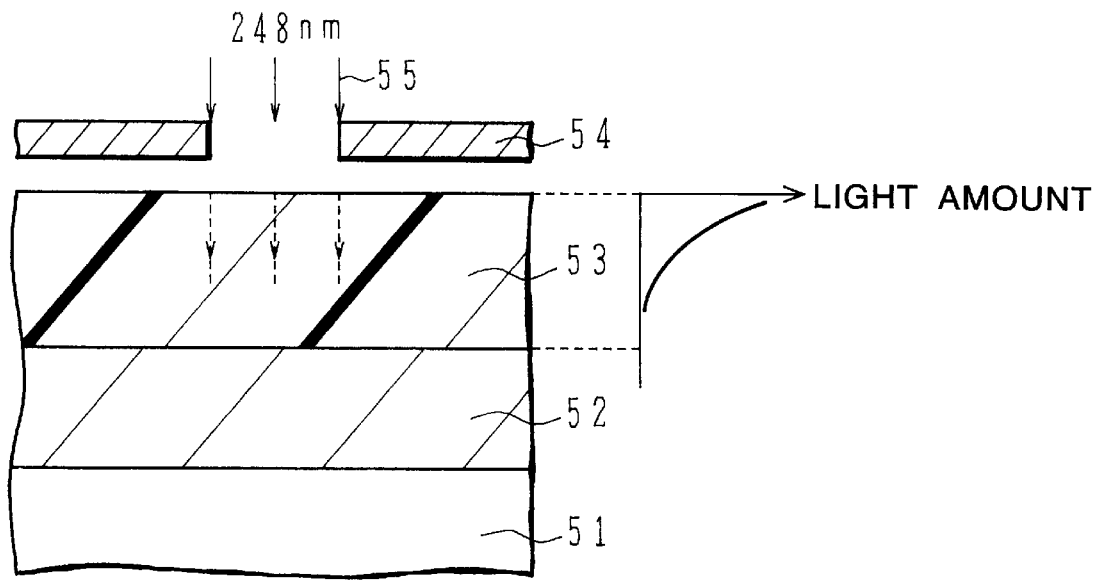
FIGS. 2A and 2B show schematic cross-sectional views of a prior art resist pattern.
Figure 2B:
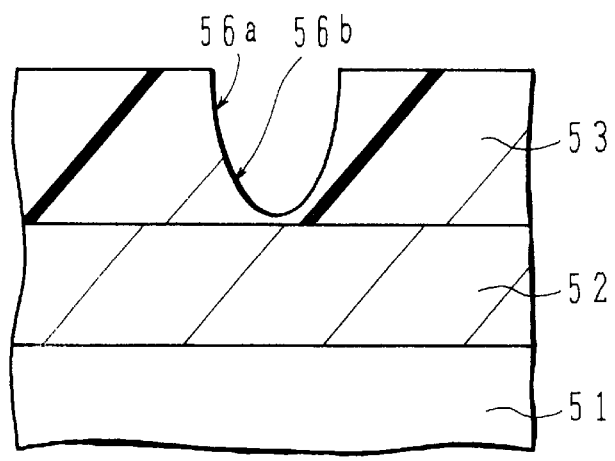

A 0.30μ line and space pattern was formed by the exposure at 40 mJ/cm² to obtain a cross-sectionally perpendicular pattern as shown in FIG. 1D. The degree of tapering was low, and no eaves were formed.

EXAMPLE 4

Added to a vinylphenol. tert-butyl methacrylate copolymer (61:39) supplied by Maruzen Petrochemnical Co., Ltd. (Japan) were 3% by weight, based on the copolymer, of triphenylsulfonium triflate as a photo acid generator and 18% by weight, based on the copolymer, of bis(phenylsulfonyl)diazomethane of the formula,

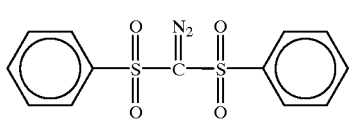

as a bleaching agent, and the mixture was dissolved in ethyl lactate to prepare a solution thereof (18 wt %) in ethyl lactate. This resist solution had an initial transmittance, at 248 nm, of about 12%/μm.

The above resist solution was applied onto a silicon wafer and baked at about 110° C. for 90 seconds to form a resist film having a thickness of 0.7 μm. The silicon wafer having the resist film formed thereon was exposed using KrF excimer stepper and baked at about 90° C. for 60 seconds. Then, the resist film was developed with a solution of a 2.38 wt % tetramethtylammonium hydroxide solution for 1 minute.

A 0.30 μm line and space (stripe) pattern was formed by the exposure at 43 mJ/cm² to obtain a cross-sectionally perpendicular pattern as shown in FIG. 1D. The degree of tapering was low, and no eaves were formed.

The following Comparative Example 3 was carried out for comparing its results with the results of Examples 3 and 4.

COMPARATIVE EXAMPLE 3

Added to a vinylphenol. tert-butyl methacrylate copolymer (61:39) were 5% by weight, based on the copolymer, of triphenylsulfonium triflate as a photo acid generator and 10% by weight, based on the copolymer, of benzophenone, (C₆H₅)₂CO, as a light absorbing agent, and the mixture was dissolved in methyl lactate to prepare a solution thereof (18 wt %) in methyl lactate. This resist solution had an initial trarismittanee, at 248 nm, of about 15%/μm.

Differing from the resists prepared in Examples 3 and 4, the resist in this Comparative Example did not contain a bleaching agent but contained the light absorbing agent.

The above-obtained resist solution was applied onto a silicon wafer and baked at about 110° C. for 90 seconds to form a resist film having a thickness of 0.7 μm. The silicon wafer having the resist film formed thereon was set at a KrF excimer laser stepper, and exposed to KrF exeimer laser light. Then, the exposed resist film was baked at about 90° C. for 60 seconds and developed with a 2.38 wt % tetramethylammonium hydroxide solution for 1 minute.

A 0.35 μm line and space pattern was formed by the exposure at 190 mJ/cm² and development. As a result, the line and space pattern was resolved, white the pattern was cross-sectionally tapered having gradually enlarged dimensions toward the bottom. The patterns obtained in Examples 3 and 4 were excellent over the pattern obtained in Comparative Example 3, although the patterns obtained in Examples 3 and 4 had a smaller pattern width than the counterpart in Comparative Example 3.

When a resist film formed on an even undersurface is exposed, it is difficult to evaluate the deterioration of a resist pattern caused by reflected light. Therefore, a resist film formed on an uneven undersurface was tested for the influence of reflected light. The material for the processable layer having a high reflectance includes siliicides of metals having a high melting point such as tungsten (W), molybdenum (Mo), titanium (Ti) and tantalum (Ta). The present invention is highly effective for decreasing the reflectance when these materials are used.

EXAMPLE 5

The same resist as that used in Example 3 was applied onto a substrate (silicon wafer) having an uneven surface and baked at about 110° C. for 90 seconds to form a resist film having a thickness of 0.7 μm. The silicon wafer having the resist film formed thereon was exposed using KrF excimer laser stepper.

The exposed resist film was baked at about 90° C. for about 60 seconds, and then developed with a 2.38% tetramethylammonium hydroxide solution for 1 minute. As a result, no narrowing of the pattern in a concave portion was found. The so-obtained pattern was cross-sectionally perpendicular as shown in FIG. 1D similarly to that in Example 3.

COMPARATIVE EXAMPLE 4

Added to a vinylphenol. tert-butyl methacrylate copolymer (61:39) was 5% by weight, based on the copolymer, of triphenylsulfonium triflate as a photo acid generator, and the mixture was dissolved in ethyl Lactate to prepare a solution thereof (18 wt. %) in ethyl lactate. Differing from the counterpart in Comparative Example 3, the-prepared resist solution contained no light absorbing agent, and it had a transmittance, at 248 nm, of about 65%/μm.

The above resist solution was applied onto a silicon substrate having an uneven surface and baked at about 110° C. for 90 seconds to form a resist film having a thickness of 0.7 μm. The silicon substrate having the resist film formed thereon was exposed using KrF excimer laser stepper.

Figure 3A:
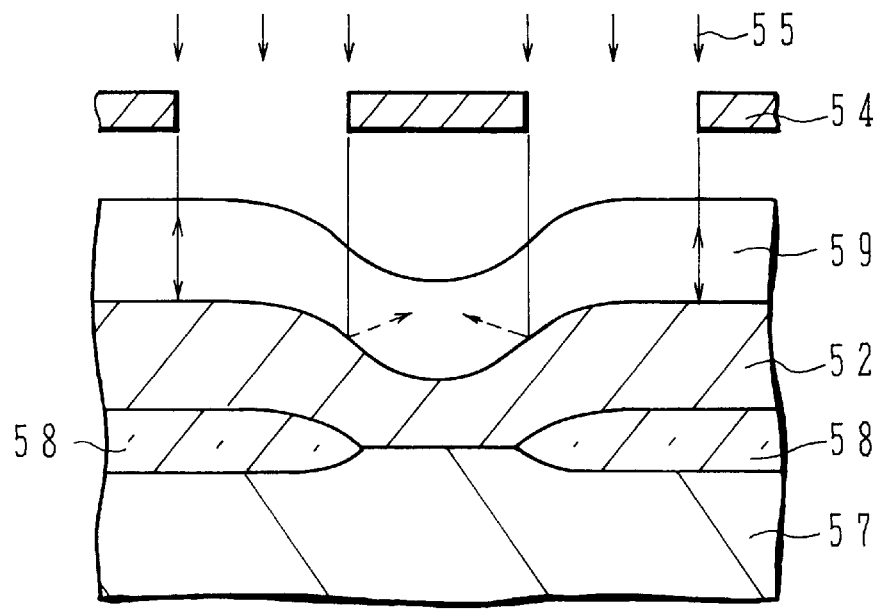
FIGS. 3A and 3B show a schematic cross-sectional view and a schematic plan view of a prior art resist pattern.
Figure 3B:
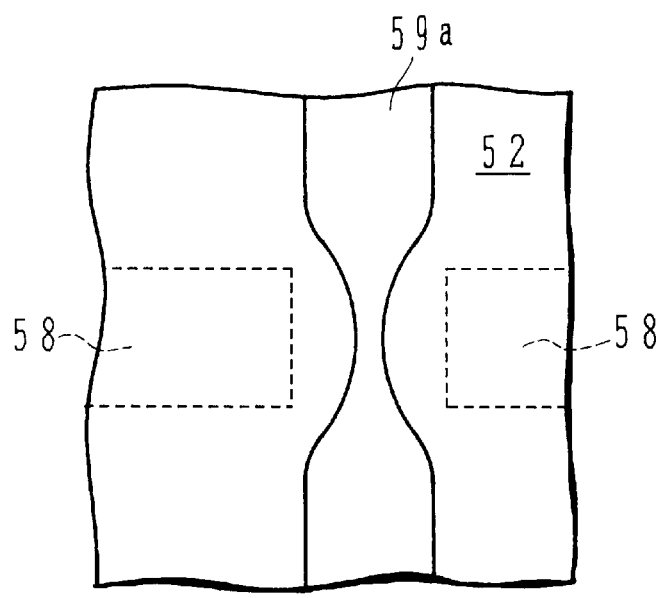
Figure 4A:
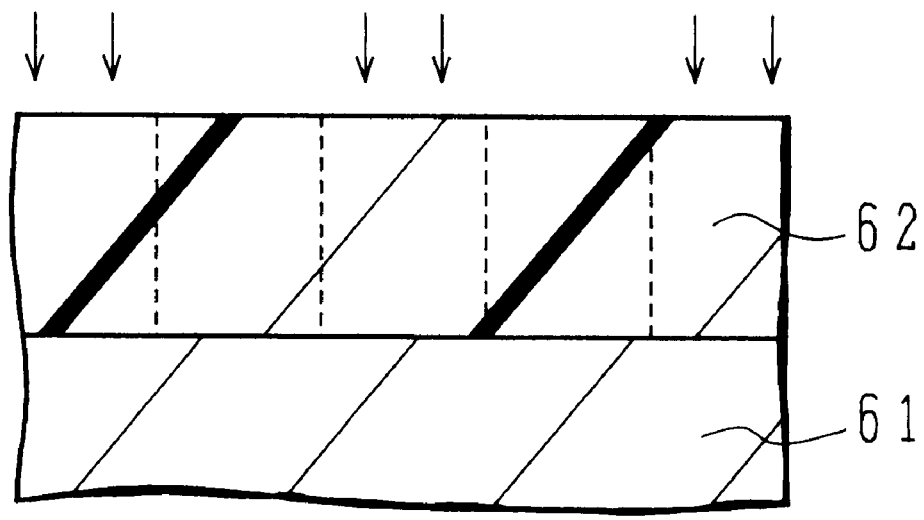
FIGS. 4A and 4B show schematic cross-sectional views of a prior art resist pattern.
Figure 4B:
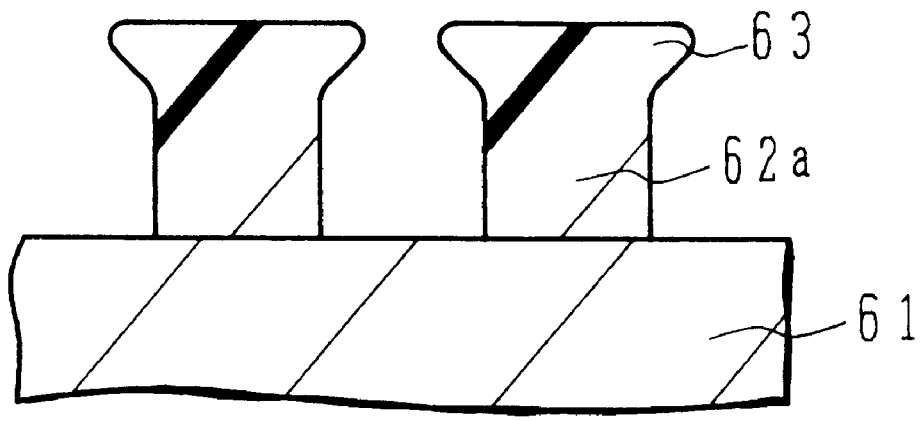

The exposed resist film was baked at about 90° C. for seconds, and then developed with a 2.38% tetramethylammonium hydroxide solution for 1 minute. As a result, there was found such narrowing of the pattern in a concave portion as explained with reference to FIG. 3.

In addition to the foregoing, resist patterns were formed under various conditions for Examples and Comparative Examples. The resist films had a thickness of 0.7 μm, and the line and space patterns were varied in line width. The forms of the so-obtained patterns were compared.

When the line width was 0.4 μm, the ratios of line width of bottom portion of resist pattern to line width of upper portion of resist pattern in Examples were 0.95–1.15 (width of bottom portion/width of upper portion) when the patterns were cross-sectionally perpendicular, while the above ratios in Comparative Examples were greater than 1.15.

When the line width was decreased to 0.35 μm, the results were almost the same as the results obtained from the line and space patterns having a width of about 0.4 μm. In Examples, the ratios of width of bottom portion/width of upper portion were 0.95–1.20, while the above ratios in Comparative Examples were greater than 1.30.

When line and space patterns were formed by further decreasing the line width to 0.3 μm, the ratios of width of bottom portion/width of upper portion in Examples were 0.95–140, while the above ratios in Comparative Examples were greater than 1.40.

Further, when no bleaching agent was added, the obtained resist patterns formed eaves in top portions as shown in FIGS. 1B and 1C, and the patterns formed slanting sides (formation of a cross section having a trapezoidal form). In the resist patterns obtained in Examples, their sides were nearly perpendicular, and the formation of eaves was remarkably decreased.

In Examples, the formation of eaves in an upper portion did not take place. The reason therefor is considered as follows. Bleaching agents decompose to generate acid under deep UV irradiation. That is, the acid formed by the reaction of the bleaching agent works as a supplement for an acid which is generated from the photo acid generator.

It is further considered that the acid generated from the bleaching agent contributes to the reaction of the base polymer similarly to the acid generated by the optically acid-generating agent. Therefore, the bleaching agent can be allowed to work as a photo acid generator as well, and in this case, the photo acid generator which has been originally added may be omitted.

The amount of the bleaching agent is preferably 3 to 20% by weight. When the amount of the bleaching agent is too small, the bleaching effect is low. When it is too large, the resist may be insolubilized. The amount of the bleaching agent is more preferably 5 to 18% by weight, particularly preferably 10 to 15% by weight.

Further, the initial transmittance Of the resist containing the bleaching agent is preferably 10 to 20%, and the transmittance thereof after the exposure is preferably at least 30%.

The present invention has been explained with reference Examples, while the present invention shall not be limited to these Examples.

For example, generally, a polymer having an adamantyl methacrylate or a polymer having a vinylphenol can be used as the base polymer. As the polymer having an adamantyl skeleton, a compound of the following formula can be used.

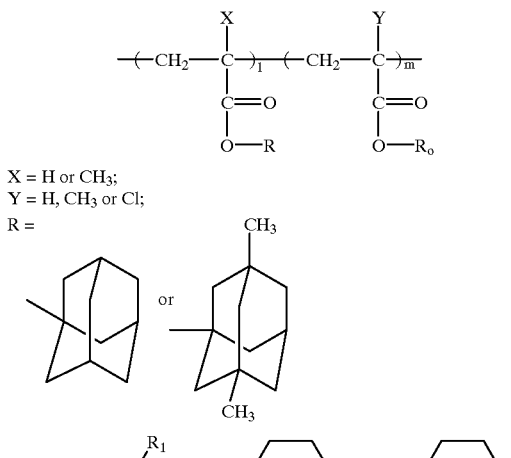

X = H or $CH_3$;
Y = H, $CH_3$ or Cl;
R =

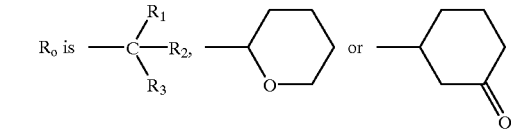

$R_o$ is 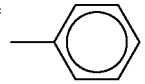

where $R_1 = R_2 = H$, and $R_3 =$ 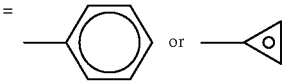

or $R_1 = CH_3$, $R_2 = H$, and $R_3 =$ 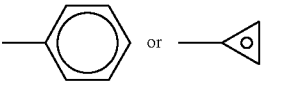

or $R_1 = R_2 = CH_3$, and $R_3 =$ or $R_1 = R_2 = R_3 = CH_3$ and $l+m=1$, where $l \neq 0$ and $m \neq 0$.

In particular, preferred is a compound of the above formula in which $R_1=R_2=R_3=CH_3$, a compound of the above formula in which $R_1=R_2=CH_3$ and $R_3 =$ 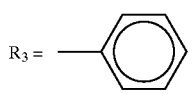

or a compound of the above formula in which the ester portion $R_o$ is

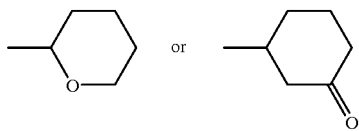

As the polymer having a vinylphenol skeleton, compounds of the following formulae can be used.

(i)

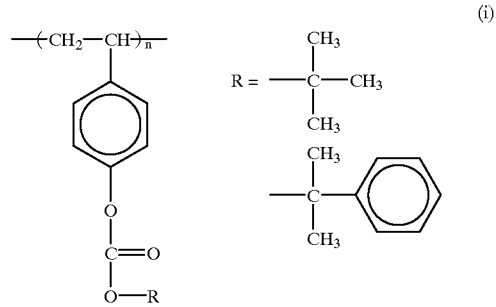

(ii)

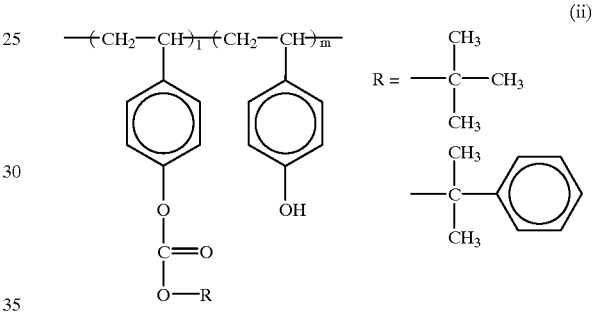

(iii)

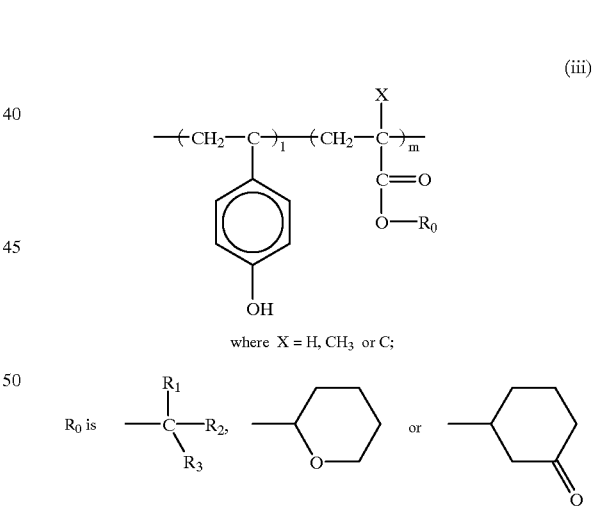

where X = H, $CH_3$ or C;

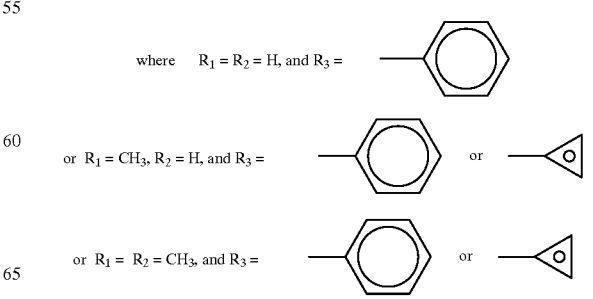

-continued or $R_1 = R_2 = R_3 = CH_3$.

Of the above compounds, particularly preferred are compounds (i) and (ii). Further, particularly preferred is a compound (iii) in which $R_1=R_2=R_3=CH_3$, a compound (iii) in which $R_1=R_2=CH_3$ and

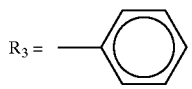

or a compound (iii) in which the ester portion is

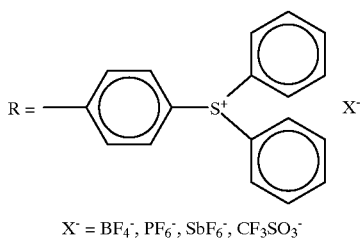

The photo acid generator is selected from a sulfonium salt, a sulfonic acid ester compound, an iodonium salt and a halogen compound. For example, the sulfonium salt includes a compound of the following formula.

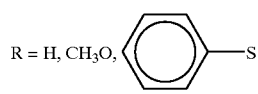

$X^- = BF_4^-, PF_6^-, SbF_6^-, CF_3SO_3^-$ $R = H, CH_3O,$ 

The sulfonic acid ester compound includes compounds of the following formulae.

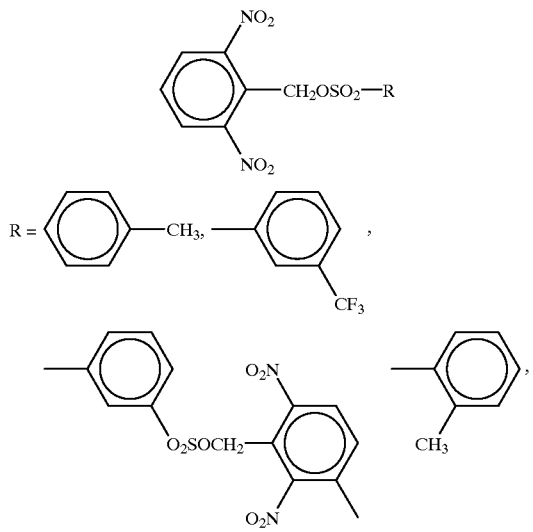

-continued

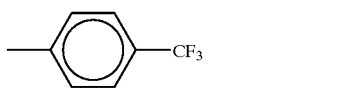

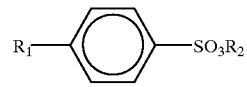

$R_1 = H, CH_3$
$R_2 = C_4H_9,$ 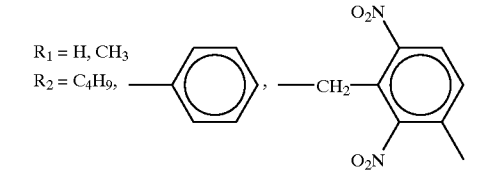

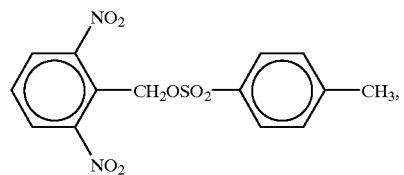

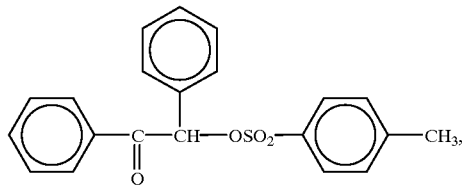

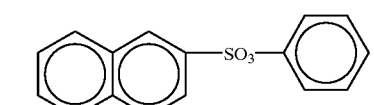

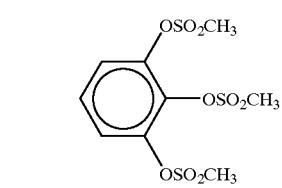

The iodonium salt includes a compound of the following formula.

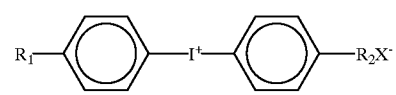

$X^- = BF_4^-, PF_6^-, SbF_6^-, CF_3SO_3^-$ $R_1 = H, CH_3O\text{---},$ 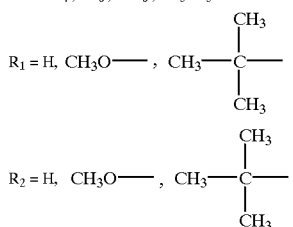

$R_2 = H, CH_3O\text{---},$

The halogen compound includes compounds of the following formulae.

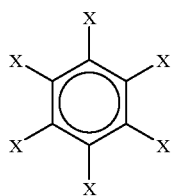

X = Br, Cl

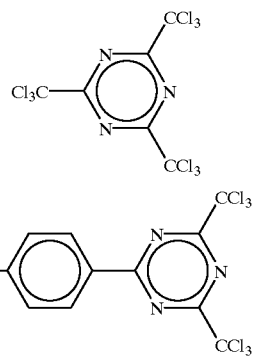

R = H, Cl, CH₃O—

The bleaching agent includes a, α-bisaryl sulfonyldiazomethane of the formula,

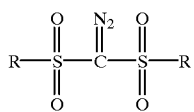

R =

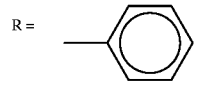

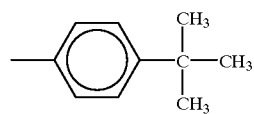

and disulfone of the formula

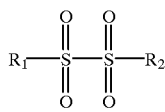

R₁ = 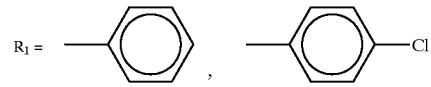

R₂ = 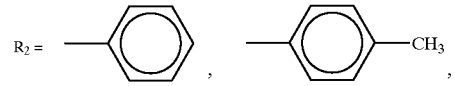

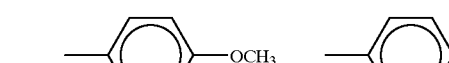

FIG. 7 shows the dependency of the transmittance of a resist containing an adamantyl fnethacrylatc. tert-butyl methacrylate copolymer and 15% by weight, and disulforie or bis(phenylsulfonyl)diazomethane under exposure dose. The initial transmittance of about 12% or about 22% changes up to about 60% at an exposure dose of about 100 mJ/cm², and then, shows a strong saturation.

It is considered that the bleaching agent has a function equivalent to that of photo acid generator, and the resist may be composed of a base polymer and the bleaching agent without the photo acid generator. In particular, sulfonic acid generated by disulfone is to work ais an acid under ultraviolet irradiation.

Clearly to one of ordinary skill. in the art, other various alterations, improvements and combination may be effected.

What is claimed is:

1. A method of exposure to ultraviolet light, comprising the steps of:

applying a resist which is a mixture of a base polymer having an adamantyl skeleton, a photo acid generator and a bleaching agent onto a substrate;

selectively exposing the resist to ultraviolet light to allow the photo acid generator and the bleaching agent to generate acids; and baking the exposed resist to deblock protective groups of the base polymer in a region exposed to ultraviolet.

2. The method of claim 1, wherein said ultraviolet light has a wavelength of 300 nm or shorter.

3. A resist for use with ultraviolet light, comprising:

a chemically amplifiable resist comprising a base polymer and a photo acid generator; and a bleaching agent added to the chemically amplifiable resist;

wherein the base skeleton has an adamantyl polymer.

4. The resist of claim 3, wherein the bleaching agent is 2,2'-bisaryl sulfonyidiazomethane.

5. The resist of claim 3, wherein the bleaching agent is added by 5–18 weight %.

6. The resist of claim 3, wherein said ultraviolet light has a wavelength of 300 nm or shorter.

7. The resist of claim 3, wherein said adamantyl skeleton is of the formula:

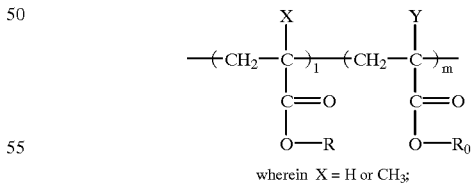

wherein X = H or CH₃;

Y = H, CH₃ or Cl;

R = 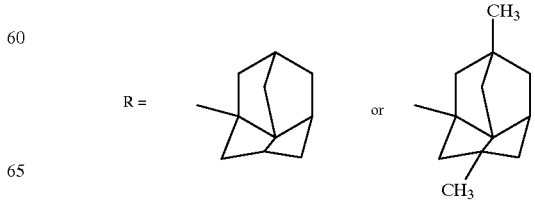

-continued $R_0$ is 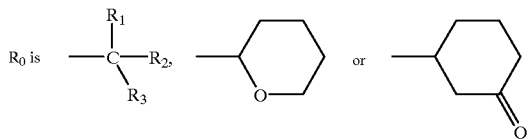

where $R_1 = R_2 = H$, and $R_3 =$ 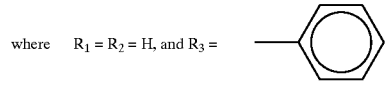

or $R_1 = CH_3$, $R_2 = H$, and $R_3 =$ 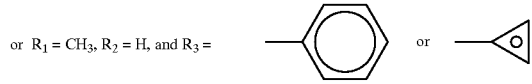

or $R_1 = R_2 = CH_3$, and $R_3 =$ 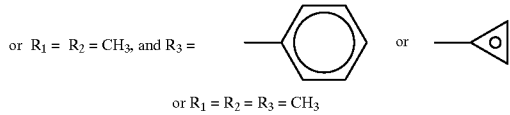

or $R_1 = R_2 = R_3 = CH_3$ and $l+m=1$, where $l\ne 0$ and $m\ne 0$.

8. The resist of claim 7, wherein $R_1=R_2=R_3=CH_3$.

9. The resist of claim 7, wherein $R_1=R_2=CH_3$, $R_3=$ $R_3 =$ 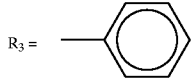

10. The resist of claim 7, wherein $R_0$ is 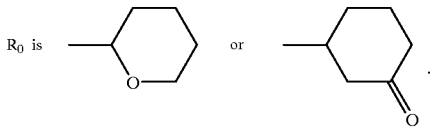.

11. The resist of claim 3, wherein the bleaching agent is disulfone.

12. The resist of claim 11, wherein the bleaching agent is added by 5–18 weight %.

* * * * *